United States Patent
Yang

(10) Patent No.: US 8,560,916 B2
(45) Date of Patent: Oct. 15, 2013

(54) METHOD FOR ENHANCING ERROR CORRECTION CAPABILITY OF A CONTROLLER OF A MEMORY DEVICE WITHOUT INCREASING AN ERROR CORRECTION CODE ENGINE ENCODING/DECODING BIT COUNT, AND ASSOCIATED MEMORY DEVICE AND CONTROLLER THEREOF

(75) Inventor: Tsung-Chieh Yang, Hsinchu (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 227 days.

(21) Appl. No.: 12/890,700

(22) Filed: Sep. 26, 2010

(65) Prior Publication Data

US 2011/0239082 A1    Sep. 29, 2011

(30) Foreign Application Priority Data

Mar. 26, 2010  (TW) ............................... 99109093 A

(51) Int. Cl.
*H03M 13/00* (2006.01)
(52) U.S. Cl.
USPC .......................................... 714/757; 714/755
(58) Field of Classification Search
USPC ................................. 714/757, 755
See application file for complete search history.

(56) References Cited

U.S. PATENT DOCUMENTS

| | | | | |
|---|---|---|---|---|
| 4,336,612 A | * | 6/1982 | Inoue et al. ..................... | 714/755 |
| 5,107,505 A | * | 4/1992 | Lelandais et al. .............. | 714/755 |
| 5,459,850 A | * | 10/1995 | Clay et al. ....................... | 711/171 |
| 5,986,933 A | * | 11/1999 | Takeuchi et al. .......... | 365/185.12 |
| 6,000,007 A | * | 12/1999 | Leung et al. ................... | 711/105 |
| 6,167,486 A | * | 12/2000 | Lee et al. ........................ | 711/120 |
| 6,327,642 B1 | * | 12/2001 | Lee et al. ........................ | 711/120 |
| 6,614,443 B1 | * | 9/2003 | Peterson ........................ | 345/569 |
| 6,708,254 B2 | * | 3/2004 | Lee et al. ........................ | 711/120 |
| 6,992,934 B1 | * | 1/2006 | Sarin et al. ................ | 365/185.23 |
| 8,001,338 B2 | * | 8/2011 | Moscibroda et al. .......... | 711/158 |
| 2007/0220406 A1 | * | 9/2007 | Gubbi et al. ................... | 714/776 |
| 2009/0055580 A1 | * | 2/2009 | Moscibroda et al. .......... | 711/104 |

* cited by examiner

*Primary Examiner* — Joseph D Torres
(74) *Attorney, Agent, or Firm* — Winston Hsu; Scott Margo

(57) ABSTRACT

A method for enhancing error correction capability of a controller of a memory device without increasing an Error Correction Code (ECC) engine encoding/decoding bit count includes: regarding a plurality of rows of a data bit array, respectively calculating a plurality of first parity codes; regarding a plurality of sets of columns of the data bit array, respectively calculating a plurality of second parity codes, wherein each set of the sets includes two or more of the columns, and the sets do not overlap; and performing encoding/decoding corresponding to the first and the second parity codes. An associated memory device and the controller thereof are further provided.

11 Claims, 10 Drawing Sheets

METHOD FOR ENHANCING ERROR CORRECTION CAPABILITY OF A CONTROLLER OF A MEMORY DEVICE WITHOUT INCREASING AN ERROR CORRECTION CODE ENGINE ENCODING/DECODING BIT COUNT, AND ASSOCIATED MEMORY DEVICE AND CONTROLLER THEREOF

BACKGROUND OF THE INVENTION

1. Field of the Invention

The present invention relates to access to a Flash memory, and more particularly, to a method for enhancing error correction capability of a controller of a memory device without increasing an Error Correction Code (ECC) engine encoding/decoding bit count, and to an associated memory device and a controller thereof.

2. Description of the Prior Art

As technologies of Flash memories progress in recent years, many kinds of portable memory devices, such as memory cards respectively complying with SD/MMC, CF, MS, and XD standards, are widely implemented in various applications. Therefore, the control of access to Flash memories in these portable memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. Although there are some solutions proposed by the related art in response to these problems, it seems unlikely that the related art gives consideration to both operation performance and system resource management. As a result, no matter which solution is chosen, a corresponding side effect typically exists.

More particularly, the error correction implemented according to the related art typically does not use up all the storage space of a Flash memory, where the remaining storage space of the Flash memory cannot be utilized for storing data, which is really wasteful. Please note that a typical reason why the related art does not use up all the storage space of the Flash memory is typically that, once an Error Correction Code (ECC) engine encoding/decoding bit count (which typically represents the error correction capability measured in bits with respect to a specific amount of data) is increased, the associated costs of the ECC engine are greatly increased. For example, regarding 1K bytes (i.e. 1024 bytes) of data, increasing the ECC engine encoding/decoding bit count from 24 bits to 36 bits will cause the chip area of the ECC engine to greatly increase, where the new value of chip area may reach approximately 1.5 times the original value of the chip area. Therefore, a novel method is required for enhancing the control of data access of a Flash memory in a memory device, in order to give consideration to both operation performance and system resource management.

SUMMARY OF THE INVENTION

It is therefore an objective of the claimed invention to provide a method for enhancing error correction capability of a controller of a memory device without increasing an Error Correction Code (ECC) engine encoding/decoding bit count, and to provide an associated memory device and a controller thereof, in order to solve the above-mentioned problems.

It is another objective of the claimed invention to provide a method for enhancing error correction capability of a controller of a memory device without increasing an ECC engine encoding/decoding bit count, and to provide an associated memory device and a controller thereof, in order to properly utilize the remaining storage space mentioned above.

According to a preferred embodiment of the claimed invention, a method for enhancing error correction capability of a controller of a memory device without increasing an ECC engine encoding/decoding bit count comprises: regarding a plurality of rows of a data bit array, respectively calculating a plurality of first parity codes; regarding a plurality of sets of columns of the data bit array, respectively calculating a plurality of second parity codes, wherein each set of the sets comprises two or more of the columns, and the sets do not overlap; and performing encoding/decoding corresponding to the first and the second parity codes.

While the method mentioned above is disclosed, an associated memory device is further provided, where error correction capability thereof is enhanced without increasing an ECC engine encoding/decoding bit count. The memory device comprises: a Flash memory comprising a plurality of blocks; and a controller arranged to access the Flash memory and manage the plurality of blocks. An ECC engine of the controller is implemented by utilizing a microprocessor and/or a control logic within the controller, and the ECC engine comprises: a first parity code calculation module; and a plurality of second parity code calculation modules. Regarding a plurality of rows of a data bit array, the first parity code calculation module respectively calculates a plurality of first parity codes. In addition, regarding a plurality of sets of columns of the data bit array, the second parity code calculation modules respectively calculate a plurality of second parity codes, wherein each set of the sets comprises two or more of the columns, and the sets do not overlap. Additionally, the ECC engine is arranged to perform encoding/decoding corresponding to the first and the second parity codes.

While the method mentioned above is disclosed, a controller of a memory device is further provided, where error correction capability of the controller is enhanced without increasing an ECC engine encoding/decoding bit count. The controller is utilized for accessing a Flash memory within the memory device, and the Flash memory comprises a plurality of blocks. The controller comprises: a read only memory (ROM) arranged to store a program code; and a microprocessor arranged to execute the program code to control the access to the Flash memory and manage the plurality of blocks. An ECC engine of the controller is implemented by utilizing a control logic within the controller and/or by utilizing the microprocessor executing the program code, and the ECC engine comprises: a first parity code calculation module; and a plurality of second parity code calculation modules. Regarding a plurality of rows of a data bit array, the first parity code calculation module respectively calculates a plurality of first parity codes. In addition, regarding a plurality of sets of columns of the data bit array, the second parity code calculation modules respectively calculate a plurality of second parity codes, wherein each set of the sets comprises two or more of the columns, and the sets do not overlap. Additionally, the ECC engine is arranged to perform encoding/decoding corresponding to the first and the second parity codes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
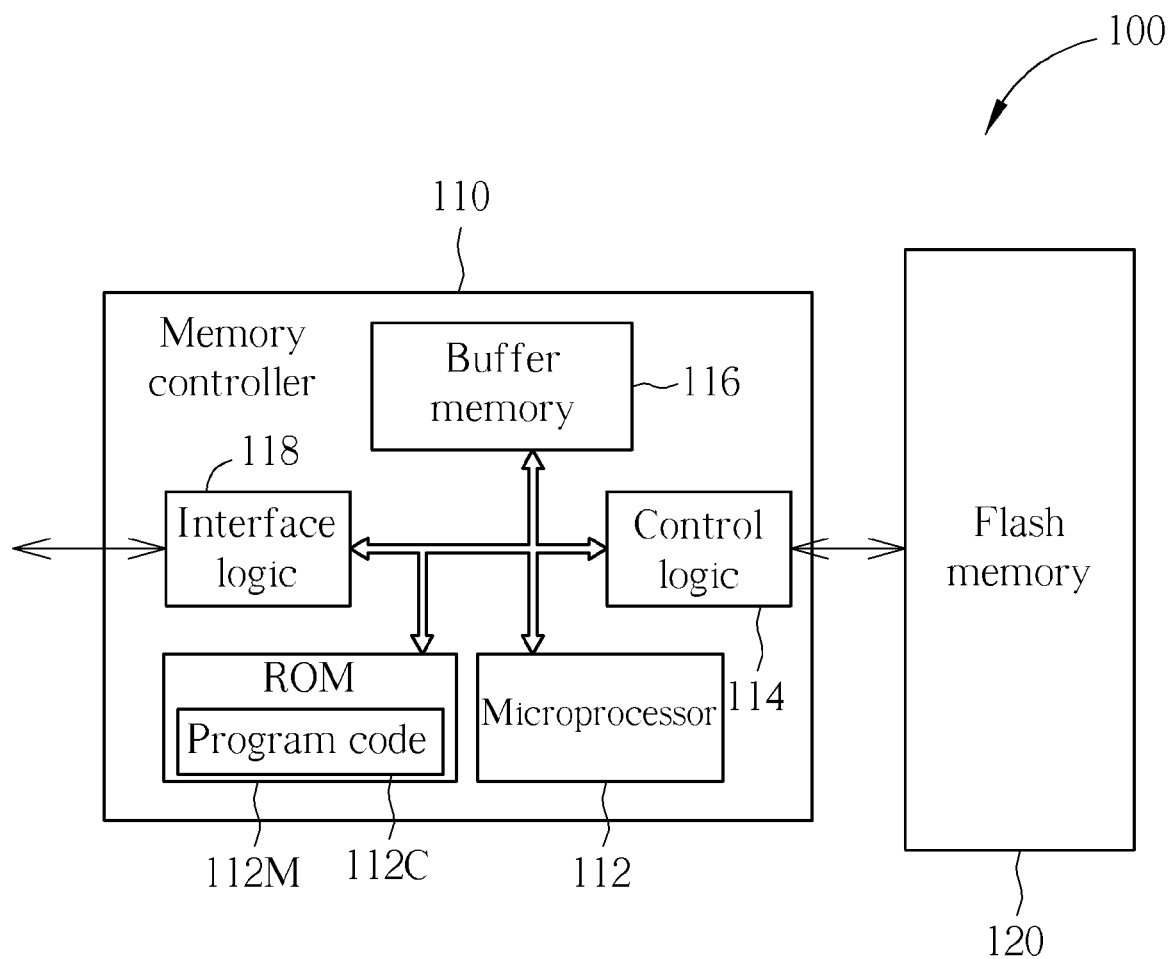
FIG. 1 is a diagram of a memory device according to a first embodiment of the present invention.

Please refer to FIG. 1, which illustrates a diagram of a memory device 100 according to a first embodiment of the present invention. In particular, the memory device 100 of this embodiment is a portable memory device, such as a memory card complying with SD/MMC, CF, MS, or XD standards. The memory device 100 comprises a Flash memory 120, and further comprises a controller arranged to access the Flash memory 120, where the aforementioned controller of this embodiment is a memory controller 110. The error correction capability of the memory device 100, and more particularly, the error correction capability of the controller such as the memory controller 110, can be enhanced without increasing an Error Correction Code (ECC) engine encoding/decoding bit count (which typically represents the error correction capability measured in bits with respect to a specific amount of data). According to this embodiment, the memory controller 110 comprises a microprocessor 112, a read only memory (ROM) 112M, a control logic 114, a buffer memory 116, and an interface logic 118. The ROM 112M is arranged to store a program code 112C, and the microprocessor 112 is arranged to execute the program code 112C to control the access to the Flash memory 120. Please note that, according to different variations of this embodiment, the program code 112C can be stored in the buffer memory 116 or any other memory.

Typically, the Flash memory 120 comprises a plurality of blocks, and the controller (e.g. the memory controller 110 that executes the program code 112C by utilizing the microprocessor 112) performs data erasure operations on the Flash memory 120 by erasing in units of blocks. In addition, a block can be utilized for recording a specific amount of pages, where the controller mentioned above performs data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device.

According to this embodiment, the memory device 100 is a memory device whose error correction capability can be enhanced without increasing the ECC engine encoding/decoding bit count. In practice, an ECC engine of the memory controller 110 can be implemented by utilizing the control logic 114 and/or by utilizing the microprocessor 112 executing the program code 112C. For example, the ECC engine is a portion of the control logic 114, and is formed with the logic circuits within the control logic 114. In another example, the program code 112C comprises some program modules/units, and the ECC engine is implemented by utilizing the microprocessor 112 executing the program modules/units. In another example, the ECC engine is implemented by utilizing the control logic 114 and by utilizing the microprocessor 112 executing the program code 112C, where the program code 112C comprises some program modules/units, and a portion of the ECC engine is implemented by utilizing the microprocessor 112 executing the program modules/units, while another portion of the ECC engine is formed with the logic circuits within the control logic 114.

Figure 2:
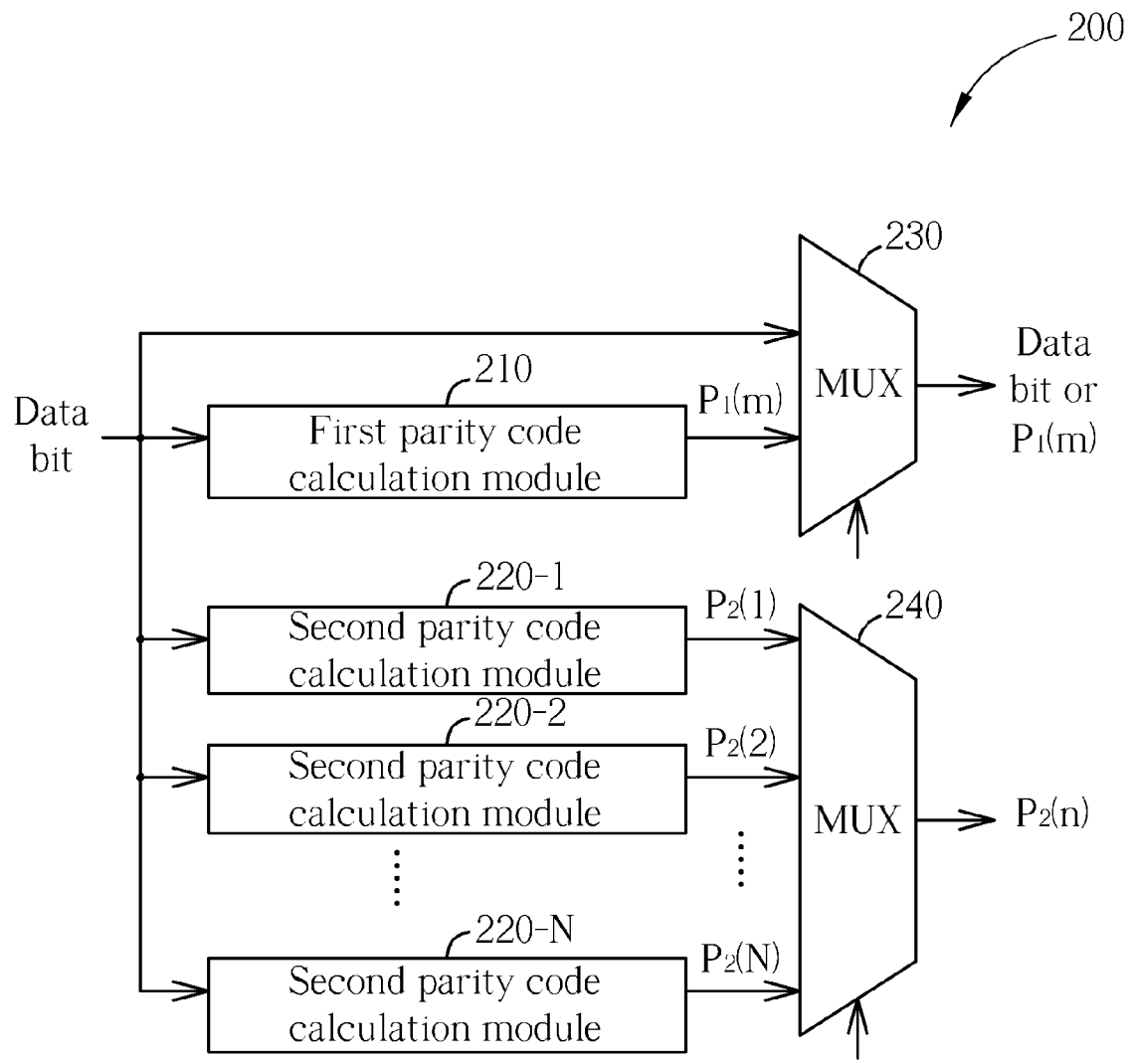
FIG. 2 is a functional block diagram of an Error Correction Code (ECC) engine within the memory controller shown in FIG. 1.
Figure 3:
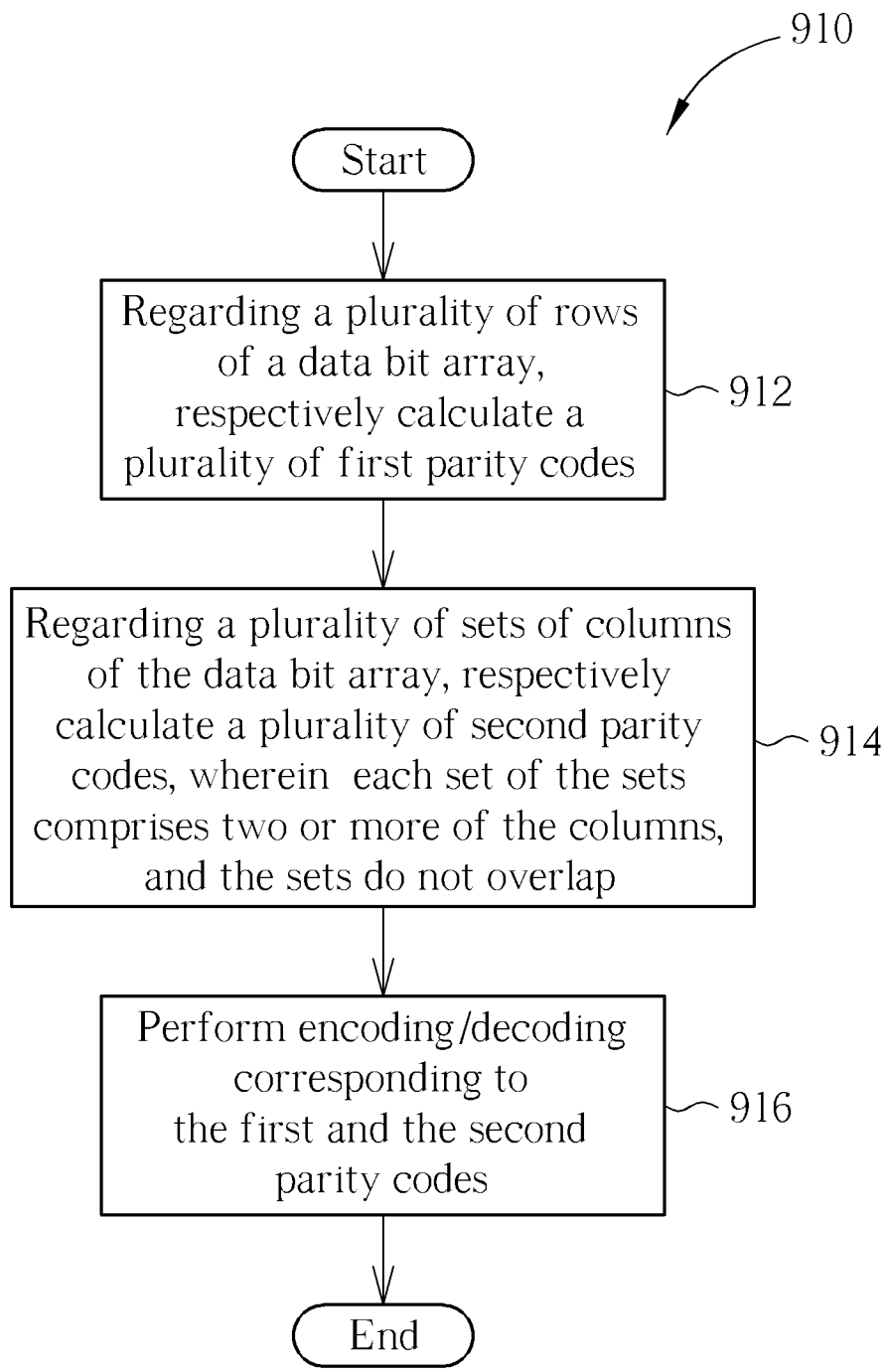
FIG. 3 is a flowchart of a method for enhancing error correction capability of a controller of a memory device without increasing an ECC engine encoding/decoding bit count according to an embodiment of the present invention.
Figure 4:
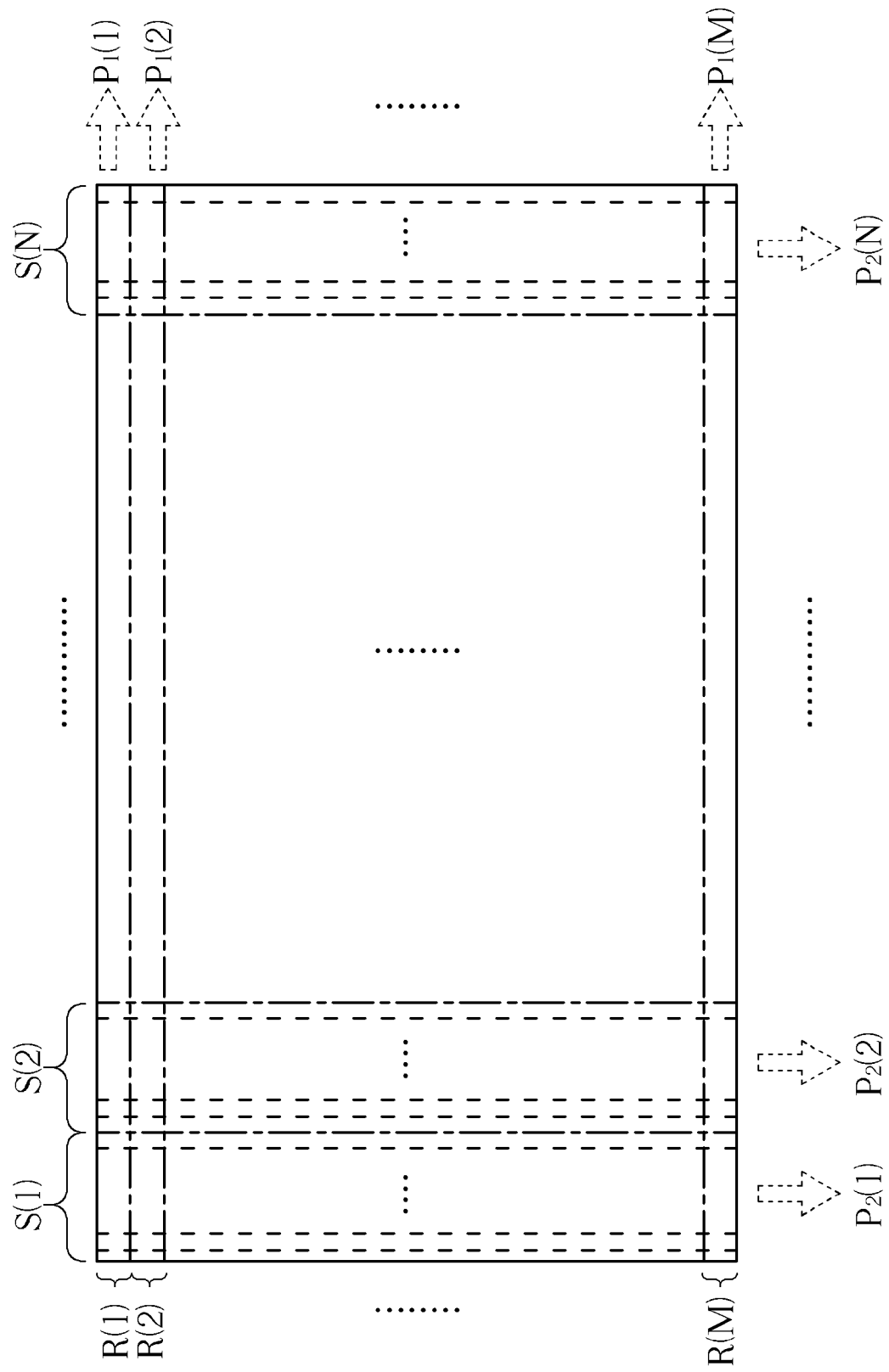
FIG. 4 illustrates a data bit array and first and second parity codes involved with the method shown in FIG. 3.

FIG. 2 is a functional block diagram of the aforementioned ECC engine. As shown in FIG. 2, the ECC engine 200 comprises a first parity code calculation module 210 and comprises a plurality of second parity code calculation modules such as N second parity code calculation modules 220-1, 220-2, ..., and 220-N, and further comprises multiplexing units 230 and 240 (labeled "MUX" in FIG. 2), where N represents a positive integer that is greater than one. Regarding a plurality of rows of a data bit array, such as M rows of the data bit array, the first parity code calculation module 210 respectively calculates M first parity codes $P_1(1), P_1(2), \ldots,$ and $P_1(M)$, where M represents a positive integer that is greater than one. In addition, regarding a plurality of sets of columns of the data bit array, such as N sets of columns of the data bit array, the second parity code calculation modules 220-1, 220-2, ..., and 220-N respectively calculate N second parity codes $P_2(1), P_2(2), \ldots,$ and $P_2(N)$, where each set of the sets comprises two or more of the columns, and the sets do not overlap. For example, the N sets are formed with X columns of data in the data bit array, where X>2N. Additionally, the multiplexing unit 230 is arranged to multiplex an input thereof as an output, and the multiplexing unit 240 is arranged to multiplex an input thereof as an output, where the ECC engine 200 is arranged to perform encoding/decoding corresponding to the first and the second parity codes. Referring to FIG. 3 and FIG. 4, related details are further described as follows.

FIG. 3 is a flowchart of a method 910 for enhancing error correction capability of a controller of a memory device without increasing an ECC engine encoding/decoding bit count according to an embodiment of the present invention, and FIG. 4 illustrates a data bit array and first and second parity codes involved with the method 910 shown in FIG. 3, where the data bit array shown in FIG. 4 can be utilized for representing the aforementioned data bit array of the data that the memory controller 110 stores into the Flash memory 120. The method can be applied to the memory device 100 shown in FIG. 1, and more particularly, to the controller mentioned above (e.g. the memory controller 110 that executes the program code 112C by utilizing the microprocessor 112). In addition, the method can be implemented by utilizing the memory device 100 shown in FIG. 1, and more particularly, by utilizing the controller mentioned above. The method 910 is described as follows.

In Step 912, regarding a plurality of rows of a data bit array, such as the M rows of the data bit array mentioned in the embodiment shown in FIG. 2, the first parity code calculation module 210 respectively calculates M first parity codes such as the first parity codes $P_1(1), P_1(2), \ldots,$ and $P_1(M)$. More particularly, regarding each row R(m) of the M rows, the first parity code calculation module 210 calculates a first parity code $P_1(m)$, where m may vary from 1 to M.

In Step 914, regarding a plurality of sets of columns of the data bit array, such as the N sets of columns of the data bit array mentioned in the embodiment shown in FIG. 2, the second parity code calculation modules 220-1, 220-2, ..., and 220-N respectively calculate N second parity codes such as the second parity codes $P_2(1), P_2(2), \ldots,$ and $P_2(N)$, where each set of the sets comprises two or more of the columns, and the sets do not overlap. More particularly, regarding a set S(n) of the plurality of sets, each second parity code calculation module 220-n calculates a second parity code $P_2(n)$, where n may vary from 1 to N. Please note that, as each set comprises two or more of the columns, rather than a single column, the respective numbers of columns to which the N second parity codes $P_2(1), P_2(2), \ldots,$ and $P_2(N)$ correspond (or the column counts respectively associated to the N second parity codes $P_2(1), P_2(2), \ldots,$ and $P_2(N)$) can be determined in a design phase of the memory controller 110 in advance, and therefore, the present invention can properly utilize the remaining storage space mentioned above, and even use up all the remaining storage space mentioned above. In addition, the present invention provides pretty great flexibility, and more particularly, allows each set to comprise two or more of the columns, so the present invention can enhance the error correction capability of the controller of the memory device without increasing the ECC engine encoding/decoding bit count.

In Step 916, the ECC engine 200 is arranged to perform encoding/decoding corresponding to the first and the second parity codes. According to this embodiment, the data bit array and the first and the second parity codes are stored in the Flash memory 120. For example, in a situation where the ECC engine 200 is arranged to perform encoding corresponding to the first and the second parity codes (e.g. during writing/programming data into the Flash memory 120), the memory controller 110 stores the data bit array and the first and the second parity codes in the Flash memory 120. In another example, in a situation where the ECC engine 200 is arranged to perform decoding corresponding to the first and the second parity codes (e.g. during reading data from the Flash memory 120), the data bit array is read from the Flash memory 120, and the ECC engine 200 performs error detection or error correction according to the first and the second parity codes that are obtained from calculations (i.e. the calculations of Step 912 and Step 914) and according to the first and the second parity codes read from the Flash memory 120 (i.e. the version stored in the Flash memory 120).

According to this embodiment, the respective column counts of the sets $S(1), S(2), \ldots,$ and $S(N)$ (i.e. the number of columns respectively in the sets $S(1), S(2), \ldots,$ and $S(N)$) can be equal to each other. This is for illustrative purposes only, and is not meant to be a limitation of the present invention. According to some variations of this embodiment, the respective column counts of the sets $S(1), S(2), \ldots,$ and $S(N)$ may be not all the same or may be different from each other.

In addition, the number of data bits in each set S(n) of this embodiment is equal to the number of data bits in each row R(m). This is for illustrative purposes only, and is not meant to be a limitation of the present invention. According to some variations of this embodiment, it is unnecessary that the number of data bits in each set S(n) is equal to the number of data bits in each row R(m).

Additionally, the number of bytes in each row R(m) of this embodiment is equal to the number of columns in each set S(n). More particularly, the number of the rows R(1), R(2), ..., and R(M) is equal to the number of the sets S(1), S(2), ..., and S(N), which means M=N. This is for illustrative purposes only, and is not meant to be a limitation of the present invention. According to some variations of this embodiment, it is unnecessary that the number of bytes in each row R(m) is equal to the number of columns in each set S(n). According to some variations of this embodiment, it is unnecessary that the number of the rows R(1), R(2), ..., and R(M) is equal to the number of the sets S(1), S(2), ..., and S(N), which means it is unnecessary to be certain that M=N.

According to an embodiment, and more particularly, a special case of the embodiment shown in FIG. 4, each row R(m) includes 1024 bytes of data, and the number of the rows R(1), R(2), ..., and R(M) is equal to 8 (i.e. M=8). In addition, each set S(n) includes 1024 columns of the plurality of sets of columns, and the number of the sets S(1), S(2), ..., and S(N) is equal to 8 (i.e. N=8). Additionally, each first parity code $P_1(m)$ includes 42 bytes, and each second parity code $P_2(n)$ includes 14 bytes.

In practice, the second parity code $P_2(n)$ may correspond to the arrangement order of a certain or some portions of the data bits within the set S(n) to which the second parity code $P_2(n)$ belongs. For example, the second parity code $P_2(n)$ may correspond to the arrangement order represented by the arrows 510-1, 510-2, ..., and 510-1024 shown in the left half of FIG. 5, while the second parity code $P_2(n)$ is obtained from calculating in a situation where the data bits within the set S(n) are regarded as being arranged in the same column in accordance with the arrangement order represented by the arrows 510-1, 510-2, ..., and 510-1024 shown in the right half of FIG. 5. This is for illustrative purposes only, and is not meant to be a limitation of the present invention. According to some variations of this embodiment, the second parity code $P_2(n)$ may correspond to the arrangement order represented by the arrows {610-1, 620-1}, {610-2, 620-2}, ..., and {610-512, 620-512} shown in the left half of FIG. 6, while the second parity code $P_2(n)$ is obtained from calculating in a situation where the data bits within the set S(n) are regarded as being arranged in the same column in accordance with the arrangement order represented by the arrows {610-1, 620-1}, {610-2, 620-2}, ..., and {610-512, 620-512} shown in the right half of FIG. 6. According to other variations of this embodiment, the arrangement order represented by the aforementioned arrows such as those shown in FIG. 5 or FIG. 6 can be varied. For example, the arrangement order represented by the aforementioned arrows can be changed to new arrangement order with the aforementioned arrows being illustrated in a horizontal direction. In another example, the arrangement order represented by the aforementioned arrows can be changed to new arrangement order with the aforementioned arrows being illustrated as any continuous path that passes through all the data bits in the set S(n).

Figure 5:
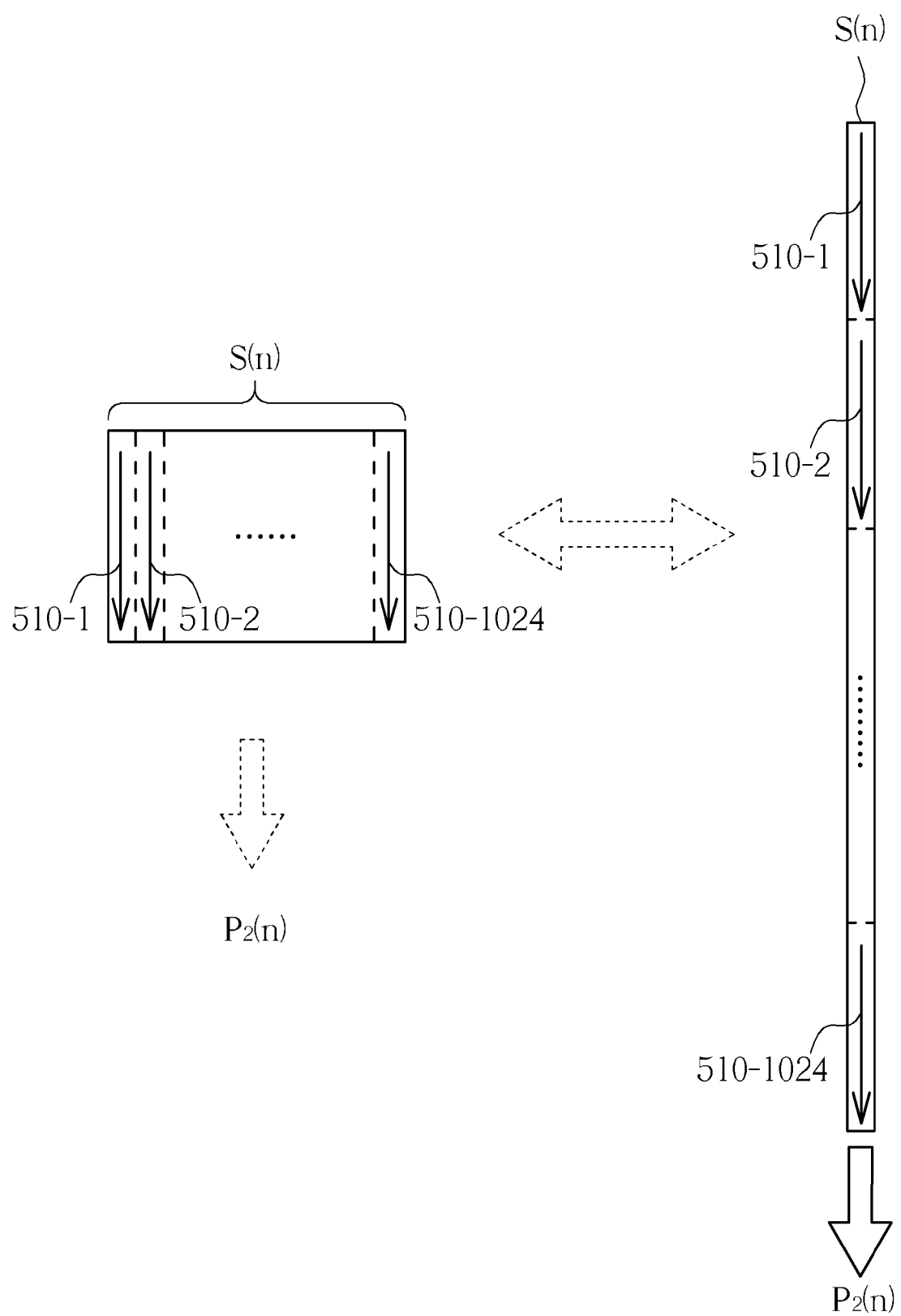
FIG. 5 illustrates how a specific second parity code of the second parity codes shown in FIG. 4 correspond to the arrangement order of the data bits within the set to which the specific second parity code belongs according to an embodiment of the present invention, where this embodiment is a special case of the embodiment shown in FIG. 4.
Figure 6:
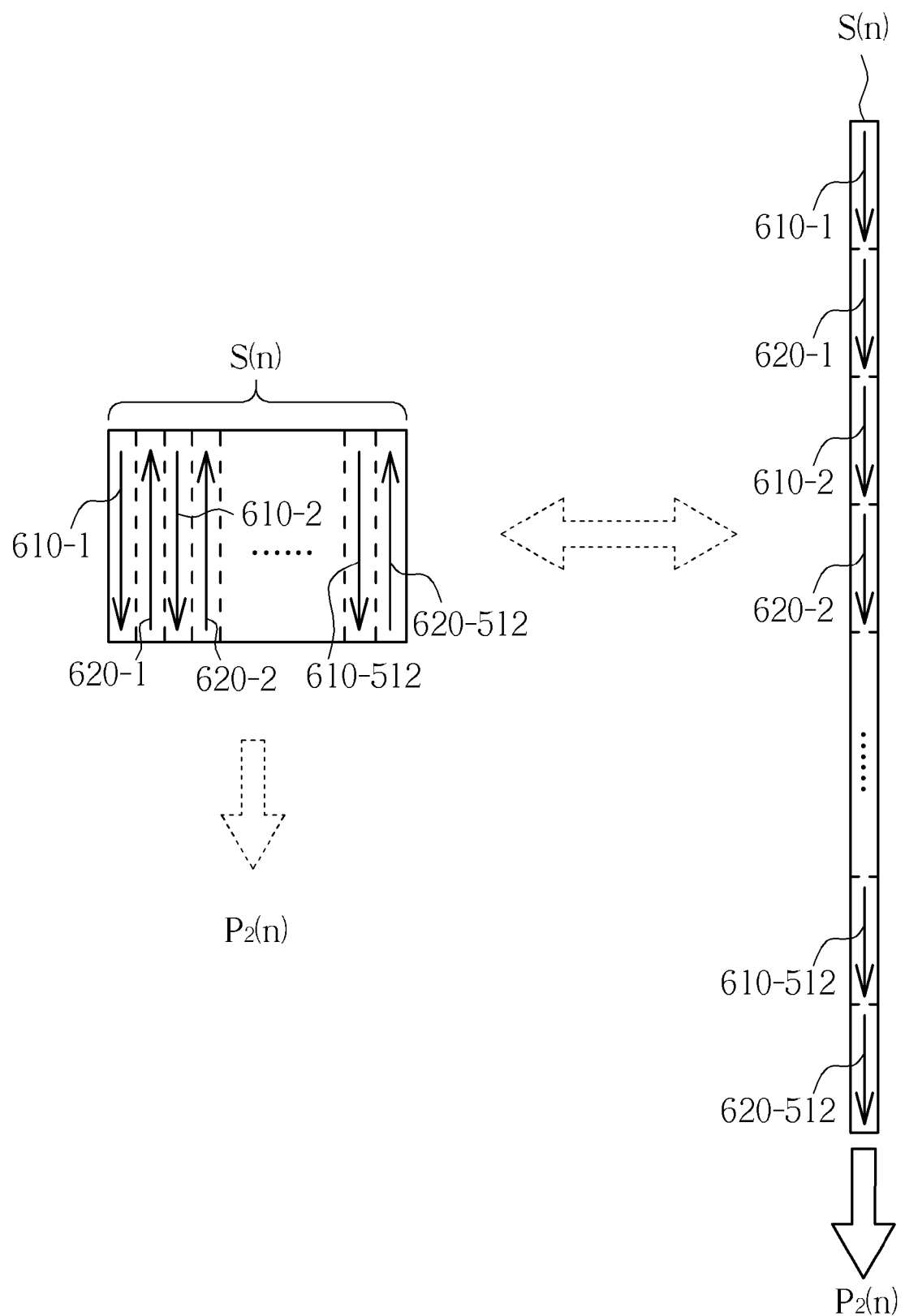
FIG. 6 illustrates how a specific second parity code of the second parity codes shown in FIG. 4 correspond to the arrangement order of the data bits within the set to which the specific second parity code belongs according to another embodiment of the present invention, where this embodiment is a variation of the embodiment shown in FIG. 5.
Figure 7:
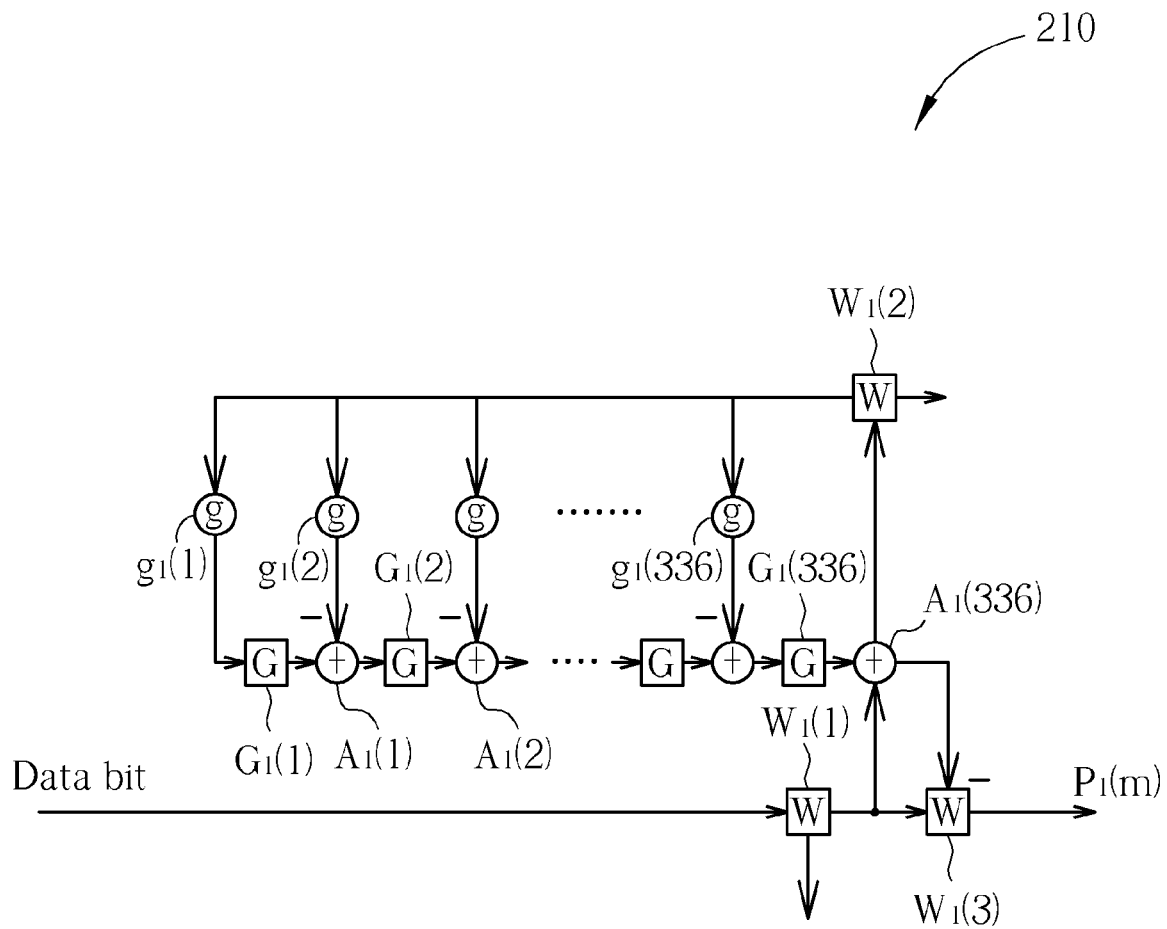
FIG. 7 illustrates some implementation details of the first parity code calculation module shown in FIG. 2 according to the embodiment shown in FIG. 5.
Figure 8:
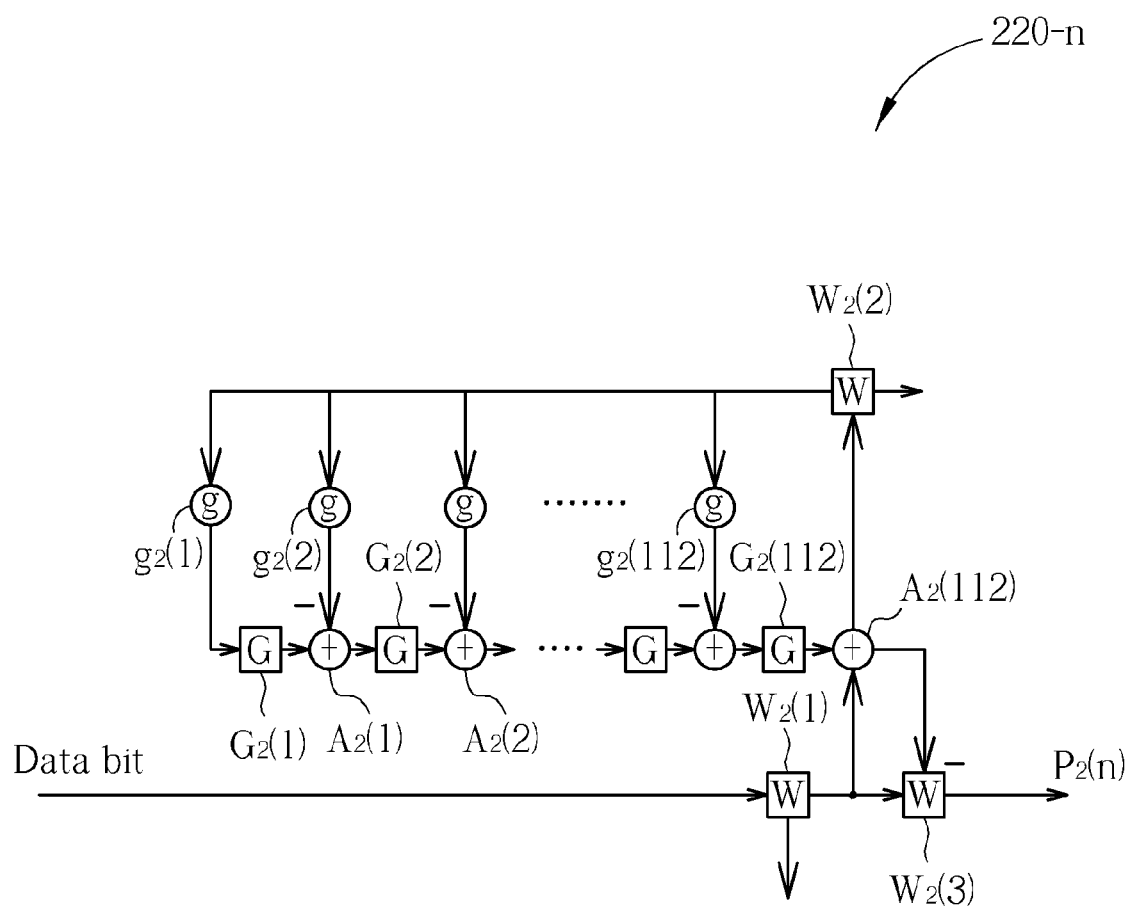
FIG. 8 illustrates some implementation details of one of the second parity code calculation modules shown in FIG. 2 according to the embodiment shown in FIG. 5.

Please refer to FIG. 7 and FIG. 8. FIG. 7 illustrates some implementation details of the first parity code calculation module 210 shown in FIG. 2 according to the embodiment shown in FIG. 5, and FIG. 8 illustrates some implementation details of one of the second parity code calculation modules shown in FIG. 2, such as the second parity code calculation module 220-n with n varying from 1 to N, according to the embodiment shown in FIG. 5. Please note that the implementation details shown in FIG. 7 and FIG. 8 can also be applied to the respective variations of the embodiment shown in FIG. 5, such as the embodiment shown in FIG. 6 or the variations of varying/changing the arrangement order represented by the aforementioned arrows. In addition, in Step 916, no matter whether the ECC engine 200 is arranged to perform encoding or decoding, all of the implementation details shown in FIG. 7 and FIG. 8 can be applied to the ECC engine 200 shown in FIG. 2.

Here, the first parity code calculation module 210 includes: at least 336 registers $G_1(1), G_1(2), \ldots,$ and $G_1(336)$ (labeled "G" in FIG. 7) arranged to temporarily store information, respectively; at least 336 adjustment units $g_1(1), g_1(2), \ldots,$ and $g_1(336)$ (labeled "g" in FIG. 7) arranged to adjust the information on the paths thereof (i.e. the respective paths where the adjustment units $g_1(1), g_1(2), \ldots,$ and $g_1(336)$ are positioned) according to their own input parameters, respectively; at least 336 arithmetic units $A_1(1), A_1(2), \ldots,$ and $A_1(336)$ (labeled "+" in FIG. 7) arranged to perform subtraction or addition operations, respectively; and at least 3 switching units $W_1(1), W_1(2),$ and $W_1(3)$ (labeled "W" in FIG. 7) arranged to switch calculation paths or input/output paths. Within the components shown in FIG. 7, for those whose input terminals are labeled with the notation "−" (e.g. the arithmetic units $A_1(1)$ and $A_1(2)$ and the switching unit $W_1(3)$), the notation "−" represents that the positive or negative signs of the inputs sent into these input terminals should be changed.

In addition, each second parity code calculation module 220-n (with n varying from 1 to N) includes: at least 112 registers $G_2(1), G_2(2), \ldots,$ and $G_2(112)$ (labeled "G" in FIG. 8) arranged to temporarily store information, respectively; at least 112 adjustment units $g_2(1), g_2(2), \ldots,$ and $g_2(112)$ (labeled "g" in FIG. 8) arranged to adjust the information on the paths thereof (i.e. the respective paths where the adjustment units $g_2(1), g_2(2), \ldots,$ and $g_2(112)$ are positioned) according to their own input parameters, respectively; at least 112 arithmetic units $A_2(1), A_2(2), \ldots,$ and $A_2(112)$ (labeled "+" in FIG. 8) arranged to perform subtraction or addition operations, respectively; and at least 3 switching units $W_2(1), W_2(2),$ and $W_2(3)$ (labeled "W" in FIG. 8) arranged to switch calculation paths or input/output paths. Within the components shown in FIG. 8, for those whose input terminals are labeled with the notation "−" (e.g. the arithmetic units $A_2(1)$ and $A_2(2)$ and the switching unit $W_2(3)$), the notation "−" represents that the positive or negative signs of the inputs sent into these input terminals should be changed. The data bits that are input into the second parity code calculation module 220-n can be input according to the arrangement order represented by the aforementioned arrows shown in FIG. 5 or FIG. 6 or according to other kinds of arrangement order.

Figure 9:
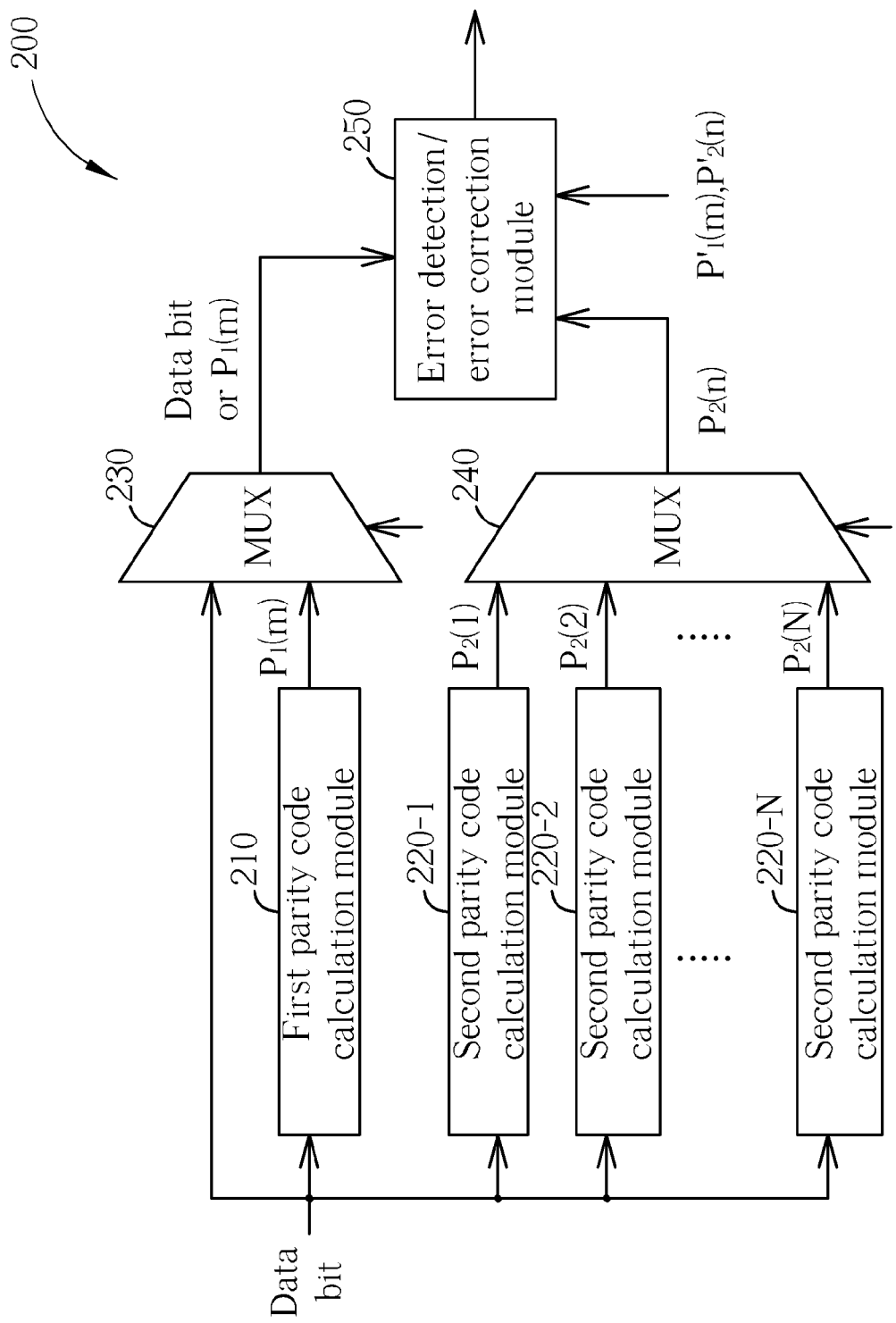
FIG. 9 illustrates some implementation details of the ECC engine shown in FIG. 2 regarding decoding according to the embodiment shown in FIG. 3.

FIG. 9 illustrates some implementation details of the ECC engine 200 shown in FIG. 2 regarding decoding (e.g. the decoding mentioned in Step 916) according to the embodiment shown in FIG. 3. As shown in FIG. 9, the ECC engine 200 further comprises an error detection/error correction module 250. The error detection/error correction module 250 is arranged to performs error detection or error correction according to the first and the second parity codes that are obtained from calculations (e.g. the parity codes $P_1(m)$ and $P_2(n)$) and according to the first and the second parity codes read from the Flash memory 120 (e.g. the parity codes $P'_1(m)$ and $P'_2(n)$).

In practice, the error detection/error correction module 250 respectively performs exclusive-or (XOR) operations on the first and the second parity codes that are obtained from calculations (e.g. the parity codes $P_1(m)$ and $P_2(n)$) and the first and the second parity codes read from the Flash memory 120 (e.g. the parity codes $P'_1(m)$ and $P'_2(n)$), in order to performs error detection. More particularly, the error detection/error correction module 250 respectively performs XOR operations on the respective bits of the first parity code $P_1(m)$ and the respective bits of the first parity code $P'_1(m)$, where m may vary from 1 to M. Similarly, the error detection/error correction module 250 respectively performs XOR operations on the respective bits of the second parity code $P_2(n)$ and the respective bits of the second parity code $P'_2(n)$, where n may vary from 1 to N. When the results of the XOR operations are all zero, the error detection/error correction module 250 determines that the data bit array read from the Flash memory 120 is non-erroneous, which means the memory controller 110 can send out the data bit array that is read from the Flash memory 120 (e.g. the memory controller 110 can send this data bit array to the host device) for further use; otherwise, the error detection/error correction module 250 performs error correction, and then the memory controller 110 can send out the corrected data bit array (e.g. the memory controller 110 can send this corrected data bit array to the host device) for further use.

Please note that, in this embodiment, the switching between the architecture shown in FIG. 2 and the architecture shown in FIG. 9 can be implemented by utilizing switching circuits (e.g. some switching circuits W). In addition, for brevity, other implementation details regarding decoding are not illustrated within the architecture shown in FIG. 9, where these implementation details (e.g. a syndrome calculator, a key equation solver (KES), etc.) are well known in the related art, and therefore, are omitted within the architecture shown in FIG. 9.

Figure 10:
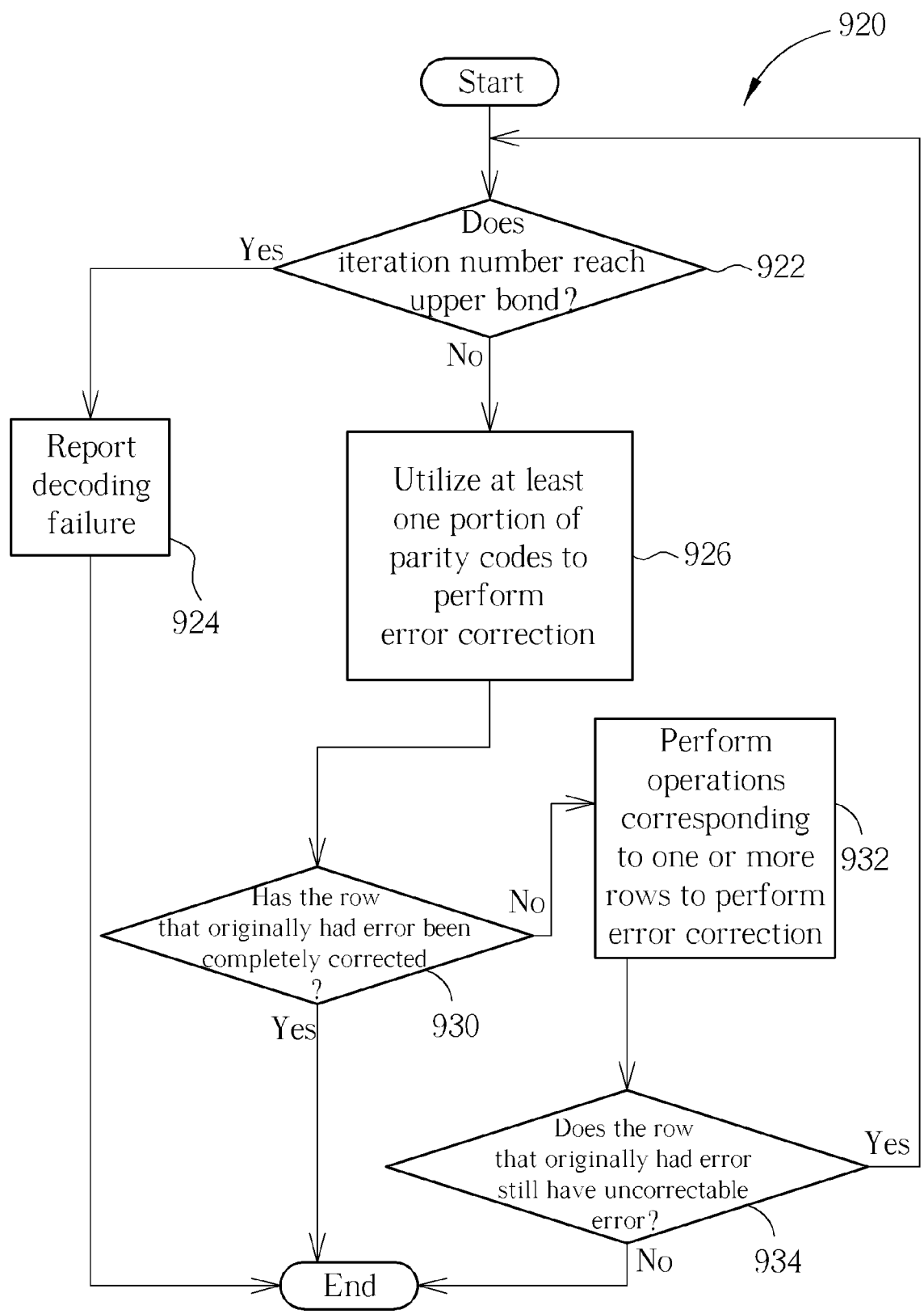
FIG. 10 illustrates some implementation details of the method shown in FIG. 3 regarding decoding according to an embodiment of the present invention.

FIG. 10 illustrates some implementation details of the method 910 shown in FIG. 3 regarding decoding according to an embodiment of the present invention, where this embodiment is a variation of the embodiment shown in FIG. 3. In a situation where a certain row (or some rows) of the rows R(1), R(2), ..., and R(M) includes at least one uncorrectable error, the ECC engine 200 executes the working flow 920 shown in FIG. 10. In particular, in a situation where a first parity code of the first parity codes is utilized for decoding data regarding a corresponding row, when it is detected that the row includes at least one uncorrectable error (e.g. a certain uncorrectable error or some uncorrectable errors), the ECC engine 200 utilizes at least one portion of the second parity codes (i.e. at least one second parity code of the second parity codes, such as one or more second parity codes) to decode data regarding the corresponding set(s), in order to correct the uncorrectable error(s). For example, the row (e.g. the first row R(1) shown in FIG. 4) includes 8K bytes (i.e. 8192 bytes) of data, and during decoding data regarding the row, the upper bond of the error correction bit count (i.e. the error correction capability measured in bits) of the ECC engine 200 with respect to 8K bytes of data is 24 bits. Thus, when there are 26 erroneous bits (i.e. 26 bits of errors) within 8K bytes of data, it is insufficient for complete correction of all the erroneous bits to decode data regarding the row by merely utilizing the first parity code. However, the 26 erroneous bits within the first row R(1) shown in FIG. 4 may be distributed over the sets (whose division lines are vertical, as shown in FIG. 4). For example, 4 erroneous bits may be distributed over the overlapped portion of the first row R(1) and the first set S(1) shown in FIG. 4, and 22 erroneous bits may be distributed over the overlapped portion of the first row R(1) and the second set S(2) shown in FIG. 4. Thus, the ECC engine 200 can utilize the second parity codes and perform error correction with the aid of the second parity codes. For example, the ECC engine 200 can utilize the second parity code $P_2(1)$ corresponding to the first set S(1) of data to perform error correction, and more particularly, to correct the 4 erroneous bits that are distributed over the overlapped portion of the first row R(1) and the first set S(1) shown in FIG. 4, in order to make the number of erroneous bits of the first row R(1) become less than 24 bits, and further to utilize the first parity code to correct the remaining erroneous bits. In another embodiment, in a situation where it is unreachable to make the number of erroneous bits of the first row R(1) become equal to or less than 24 bits after utilizing the second parity code $P_2(1)$ corresponding to the first set S(1) of data to perform error correction, the ECC engine 200 can utilize the second parity code $P_2(2)$ corresponding to the second set S(2) of data to perform error correction, and so on. Therefore, without increasing the ECC engine encoding/decoding bit count, the present invention can enhance the error correction capability of the controller by utilizing at least one portion of the second parity codes to decode data regarding the corresponding set(s). The working flow 920 is described as follows.

In Step 922, the ECC engine 200 checks whether the iteration number reaches an upper bond, where this upper bond is determined in advance in the design phase of the memory controller 110, and the initial value of the iteration number can be zero (or a certain constant). In an embodiment, the iteration number may represent the number of times of utilizing the first/second parity codes to perform error correction. When it is detected that the iteration number reaches the upper bond, Step 924 is entered; otherwise, Step 926 is entered.

In Step 924, the ECC engine 200 reports decoding failure. After Step 924 is executed, the working flow 920 is ended.

In Step 926, the ECC engine 200 utilizes at least one portion of the second parity codes to perform error correction. For example, the ECC engine 200 performs operations corresponding to one or more sets (i.e. one or more sets of the sets S(1), S(2), . . . , and S(N)) to perform error correction, and more particularly, performs error correction according to at least one portion of the second parity codes.

In Step 930, the ECC engine 200 checks whether the row(s) that originally had error(s) has been completely corrected. When it is detected that the row(s) that originally had error(s) has been completely corrected, the working flow 920 is ended; otherwise, Step 932 is entered.

In Step 932, the ECC engine 200 performs operations corresponding to one or more rows (i.e. one or more rows of the rows R(1), R(2), . . . , and R(M)) to perform error correction, and more particularly, performs error correction according to at least one portion of the first parity codes.

In Step 934, the ECC engine 200 checks whether the row(s) that originally had error(s) still has uncorrectable error(s). When it is detected that the row(s) that originally had error(s) still has uncorrectable error(s), Step 922 is re-entered, where the iteration number is increased correspondingly; otherwise, the working flow 920 is ended.

It is an advantage of the present invention that the error correction implemented according to the present invention can properly utilize the remaining storage space mentioned above, and the related art problem of wasting the storage space of the Flash memory is no longer an issue. In contrast to the related art, the present invention can enhance the error correction capability of the controller of the memory device without increasing the ECC engine encoding/decoding bit count. Therefore, in a situation where the chip area and the associated costs are not increased, the present invention can achieve the goal of giving consideration to both operation performance and system resource management.

Those skilled in the art will readily observe that numerous modifications and alterations of the device and method may be made while retaining the teachings of the invention.

What is claimed is:

1. A method for enhancing error correction capability of a controller of a flash memory device comprising:

checking whether an iteration number for decoding encoded data reaches an upper bond, wherein the upper bond is determined in advance for the memory controller, and the encoded data is encoded by an encoding procedure comprising:

regarding a plurality of rows of a data bit array, respectively calculating a plurality of first parity codes;

regarding a plurality of sets of columns of the data bit array, respectively calculating a plurality of second parity codes, wherein each set of the sets comprises two or more of the columns, and the sets do not overlap; and performing encoding corresponding to the first and the second parity codes;

when the iteration number reaches the upper bond, reporting decoding failure, otherwise, utilizing at least one portion of the second parity codes to perform first error correction upon corresponding columns and then checking, based upon the first error correction, whether at least one row that originally had at least one error has been completely corrected;

when the row that originally had error have not been completely corrected, performing operations corresponding to one or more rows of the plurality of rows to perform second error correction according to at least one portion of the first parity codes and further checking whether the row that originally had error still have uncorrectable error; and when the row that originally had error still has uncorrectable error, increasing the iteration number and re-checking whether the iteration number for decoding the encoded data reaches the upper bond in order to iteratively perform at least one of the first error correction and the second error correction until either the encoded data is decoded successfully or the decoding failure is reported.

2. The method of claim 1, wherein the iteration number represents a number of times of iteratively performing the at least one of the first error correction and the second error correction.

3. The method of claim 1, wherein respective column counts of the sets are equal to each other; and a number of data bits in each set is equal to a number of data bits in each row.

4. The method of claim 1, wherein the data bit array and the first and the second parity codes are stored in a Flash memory within the memory device.

5. A memory device, error correction capability thereof being enhanced, the memory device comprising:
   a Flash memory comprising a plurality of blocks; and
   a controller arranged to access the Flash memory and manage the plurality of blocks, wherein an ECC engine of the controller is implemented by utilizing a microprocessor and/or a control logic within the controller, and the ECC engine comprises:
      a first parity code calculation module, wherein regarding a plurality of rows of a data bit array, the first parity code calculation module respectively calculates a plurality of first parity codes; and
      a plurality of second parity code calculation modules, wherein regarding a plurality of sets of columns of the data bit array, the second parity code calculation modules respectively calculate a plurality of second parity codes, wherein each set of the sets comprises two or more of the columns, and the sets do not overlap;
   wherein the ECC engine is arranged to perform encoding corresponding to the first and the second parity codes to generate encoded data;
   the ECC engine is arranged to check whether an iteration number for decoding the encoded data reaches an upper bond, wherein the upper bond is determined in advance for the controller;
   when the iteration number reaches the upper bond, the ECC engine reports decoding failure, otherwise, the ECC engine utilizes at least one portion of the second parity codes to perform first error correction and then checks, based upon the first error correction, whether row(s) that originally had error(s) have been completely corrected;
   when it is detected that the row(s) that originally had error(s) have not been completely corrected, the ECC engine performs operations corresponding to one or more rows of the plurality of rows to perform second error correction according to at least one portion of the first parity codes and further checks whether the row(s) that originally had error(s) still have uncorrectable error(s); and
   when it is detected that the row(s) that originally had error(s) still have uncorrectable error(s), the ECC engine increases the iteration number and re-checks whether the iteration number for decoding the encoded data reaches the upper bond in order to iteratively perform at least one of the first error correction and the second error correction until either the encoded data is decoded successfully or the decoding failure is reported.

6. The memory device of claim 5, wherein the iteration number represents a number of times of iteratively performing the at least one of the first error correction and the second error correction.

7. The memory device of claim 5, wherein respective column counts of the sets are equal to each other; and a number of data bits in each set is equal to a number of data bits in each row.

8. The memory device of claim 5, wherein in a situation where the ECC engine is arranged to perform encoding corresponding to the first and the second parity codes, the controller stores the data bit array and the first and the second parity codes in the Flash memory.

9. A controller of a memory device, error correction capability of the controller being enhanced without increasing an Error Correction Code (ECC) engine encoding and decoding bit count, the controller being utilized for accessing a Flash memory within the memory device, the Flash memory comprising a plurality of blocks, the controller comprising:
   a read only memory (ROM) arranged to store a program code; and
   a microprocessor arranged to execute the program code to control the access to the Flash memory and manage the plurality of blocks;
   wherein an ECC engine of the controller is implemented by utilizing a control logic within the controller and/or by utilizing the microprocessor executing the program code, and the ECC engine comprises:
      a first parity code calculation module, wherein regarding a plurality of rows of a data bit array, the first parity code calculation module respectively calculates a plurality of first parity codes; and
      a plurality of second parity code calculation modules, wherein regarding a plurality of sets of columns of the data bit array, the second parity code calculation modules respectively calculate a plurality of second parity codes, wherein each set of the sets comprises two or more of the columns, and the sets do not overlap;
   wherein the ECC engine is arranged to perform encoding corresponding to the first and the second parity codes to generate encoded data;
   the ECC engine is arranged to check whether an iteration number for decoding the encoded data reaches an upper bond, wherein the upper bond is determined in advance for the controller;
   when it is detected that the iteration number reaches the upper bond, the ECC engine reports decoding failure, otherwise, the ECC engine utilizes at least one portion of the second parity codes to perform first error correction and then checks, based upon the first error correction, whether row(s) that originally had error(s) have been completely corrected;
   when it is detected that the row(s) that originally had error(s) have not been completely corrected, the ECC engine performs operations corresponding to one or more rows of the plurality of rows to perform second error correction according to at least one portion of the first parity codes and further checks whether the row(s) that originally had error(s) still have uncorrectable error(s); and
   when it is detected that the row(s) that originally had error(s) still have uncorrectable error(s), the ECC engine increases the iteration number and re-checks whether the iteration number for decoding the encoded data reaches the upper bond in order to iteratively perform at least one of the first error correction and the second error correction until either the encoded data is decoded successfully or the decoding failure is reported.

10. The controller of claim 9, wherein the iteration number represents a number of times of iteratively performing the at least one of the first error correction and the second error correction.

11. The controller of claim 9, wherein respective column counts of the sets are equal to each other; and a number of data bits in each set is equal to a number of data bits in each row.

* * * * *